(12) United States Patent
Lee et al.

(10) Patent No.: US 8,344,485 B1
(45) Date of Patent: Jan. 1, 2013

(54) ANTICOUNTERFEITING SYSTEM AND METHOD FOR INTEGRATED CIRCUITS

(75) Inventors: Kang Lee, Woodland Hills, CA (US); Thomas Forrester, Hacienda Heights, CA (US); Eric Gans, Los Angeles, CA (US); Kevin Carl Walter, Aliso Viejo, CA (US); Tomasz Jannson, Torrance, CA (US)

(73) Assignee: Physical Optics Corporation, Torrance, CA (US)

( * ) Notice: Subject to any disclaimer, the term of this patent is extended or adjusted under 35 U.S.C. 154(b) by 7 days.

(21) Appl. No.: 12/902,054

(22) Filed: Oct. 11, 2010

Related U.S. Application Data

(63) Continuation of application No. 12/875,956, filed on Sep. 3, 2010.
(60) Provisional application No. 61/239,719, filed on Nov. 3, 2009.

(51) Int. Cl.
*H01L 23/552* (2006.01)
(52) U.S. Cl. ............... 257/659; 257/660; 257/E23.121; 438/124

(58) Field of Classification Search .................. None
See application file for complete search history.

(56) References Cited

U.S. PATENT DOCUMENTS

| | | | |
|---|---|---|---|
| 5,874,777 A * | 2/1999 | Ohmi et al. ................ | 257/758 |
| 6,049,103 A * | 4/2000 | Horikawa et al. ............ | 257/303 |
| 7,224,039 B1 * | 5/2007 | McGuire et al. ............ | 257/532 |
| 8,084,855 B2 * | 12/2011 | Lower et al. ................ | 257/701 |
| 2006/0278932 A1 * | 12/2006 | Kothandaraman et al. ... | 257/368 |
| 2007/0117911 A1 * | 5/2007 | Irwin et al. .................... | 524/495 |
| 2008/0050512 A1 * | 2/2008 | Lower et al. .................. | 427/58 |
| 2008/0093728 A1 * | 4/2008 | Mahler et al. ................ | 257/701 |

* cited by examiner

*Primary Examiner* — Benjamin Sandvik
(74) *Attorney, Agent, or Firm* — Sheppard Mullin; Richter & Hampton LLP

(57) ABSTRACT

An integrated circuit die comprises a device layer comprising a plurality of semiconductor devices; an interconnect layer comprising a plurality of interconnect paths connecting the semiconductor devices and embedded in a dielectric material; and a plurality of hard nanoparticles embedded in the dielectric material of the interconnect layer, the hard nanoparticles having a hardness greater than a hardness of the dielectric material and of a hardness of the interconnect paths.

30 Claims, 5 Drawing Sheets

ANTICOUNTERFEITING SYSTEM AND METHOD FOR INTEGRATED CIRCUITS

CROSS-REFERENCE TO RELATED APPLICATIONS

This application is a continuation of and claims the benefit of U.S. application Ser. No. 12/875,956, filed on Sep. 3, 2010, which claims the benefit of U.S. Provisional Application No. 61/239,719, filed Nov. 3, 2009, each of which is hereby incorporated herein by reference in the respective entirety of each.

TECHNICAL FIELD

The present invention relates generally to integrated circuit manufacture, and more particularly, some embodiments relate to anticounterfeiting protection for integrated circuits.

DESCRIPTION OF THE RELATED ART

The electronic industry faces a major challenge in ensuring the integrity of the supply chain of its electronic components. Malfunctioning of a single integrated circuit (IC) or part because of a hidden malicious feature can lead to loss of a critical and expensive mission. The number of counterfeit parts detected and reported by the Government industry Data Exchange Program (GIDEP) is increasing, posing a clear national security risk. The U.S. depends on space assets more than any other country in the world an advantage noticed by many, particularly our adversaries. An asymmetric response by disabling a major U.S. satellite (e.g., through counterfeiting) is therefore a highly attractive and effective way to harm our security. Reports show an increase in counterfeit parts entering the supply chain of electronic components, with particular danger coining from integrated circuits with hidden malicious features intentionally injected into the supply chain. Such malicious counterfeit electronic parts present a special danger to the IC industry. Not only are its space systems expensive, but they perform critical national security functions. A mission loss due to a malfunctioning integrated circuit may have dire national security consequences because it may take years to reconstitute lost mission capabilities.

In general, the IC counterfeiting effects can be pursued in two major ways: (1) by behavioristic sampling; or (2) by microscopic imaging. The first method (behavioristic sampling) is more traditional; it is based on probing of IC electrical response under impulse sampling. This method is based on some a priori information and can give only some fragmented results. In contrast, the second method, based on IC 3D imaging at nanoscale, can reveal all the IC details without a priori information.

A typical modern IC die includes a plurality of devices, such as transistors, resistors, etc. . . . , patterned onto a semiconductor. These devices are connected through a plurality of conductive interconnects, such as copper, or aluminum, that are embedded in layers of dielectric material, such as silicon dioxide or low-κ materials, such as carbon-doped silicon dioxide or spin-on organic polymeric dielectric. The interconnect architecture determines the functionality of the IC.

The three dimensional nature of the IC die prevents two dimensional imaging, such as scanning electron microscopy (SEM imaging), from determining the design of the IC. Accordingly, counterfeiting typically uses a three dimensional imaging technique such as focused ion beam (FIB) imaging or x-ray based imaging.

FIB imaging is a destructive imaging process. An ion beam is focused onto a sample and causes evaporation of the sample at the location, creating ions and secondary electrons. The secondary electrons and ions can be collected and focused by electrostatic lenses for imaging purposes. A raster scan at the sample allows the entire sample surface to be imaged. This process may then be repeated to image the next layer, which was exposed by the sample evaporation of the above layer. FIB may be used to prepare samples for two-dimensional non-destructive imaging, such as SEM imaging.

In x-ray imaging, typically, hard x-rays with photon energies greater than 10 keV and an x-ray lens system are used to image the sample, either through transmission imaging, as in a standard radiography or computed tomography, or through backscatter imaging, such as Compton tomography.

BRIEF SUMMARY OF EMBODIMENTS OF THE INVENTION

The present invention is directed toward integrated circuits (ICs) having anticounterfeiting measures. In some embodiments, the dielectric material that contains the interconnects connecting the semiconductor devices of the IC are embedded with hard nanoparticles. The hard nanoparticles disrupt the use of FIB imaging to image the IC. In some embodiments, the hard nanoparticles have varying sizes to prevent tuning the FIB machine to mitigate the effect of the hard nanoparticles. In further embodiments, the IC die is protected with an x-ray blocking material that comprises a highly attenuating material and highly noisy material. The x-ray blocking material prevents the use of x-ray imaging, whether transmissive or back-scattering, and may comprise a single homogenous material or a plurality of different material layers.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the figures included herein illustrate various embodiments of the invention from different viewing angles. Although the accompanying descriptive text may refer to such views as "top," "bottom" or "side" views, such references are merely descriptive and do not imply or require that the invention be implemented or used in a particular spatial orientation unless explicitly stated otherwise.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THE INVENTION

The present invention is directed toward integrated circuits (ICs) having anticounterfeiting measures. In some embodiments, the dielectric material that contains the interconnects connecting the semiconductor devices of the IC are embedded with hard nanoparticles. The hard nanoparticles disrupt the use of FIB imaging to image the IC. In some embodiments, the hard nanoparticles have varying sizes to prevent tuning the FIB machine to mitigate the effect of the hard nanoparticles. In further embodiments, the IC die is protected with an x-ray blocking material that comprises a highly attenuating material and highly noisy material. The x-ray blocking material prevents the use of x-ray imaging, whether transmissive or back-scattering, and may comprise a single homogenous material or a plurality of different material layers.

Figure 1A:
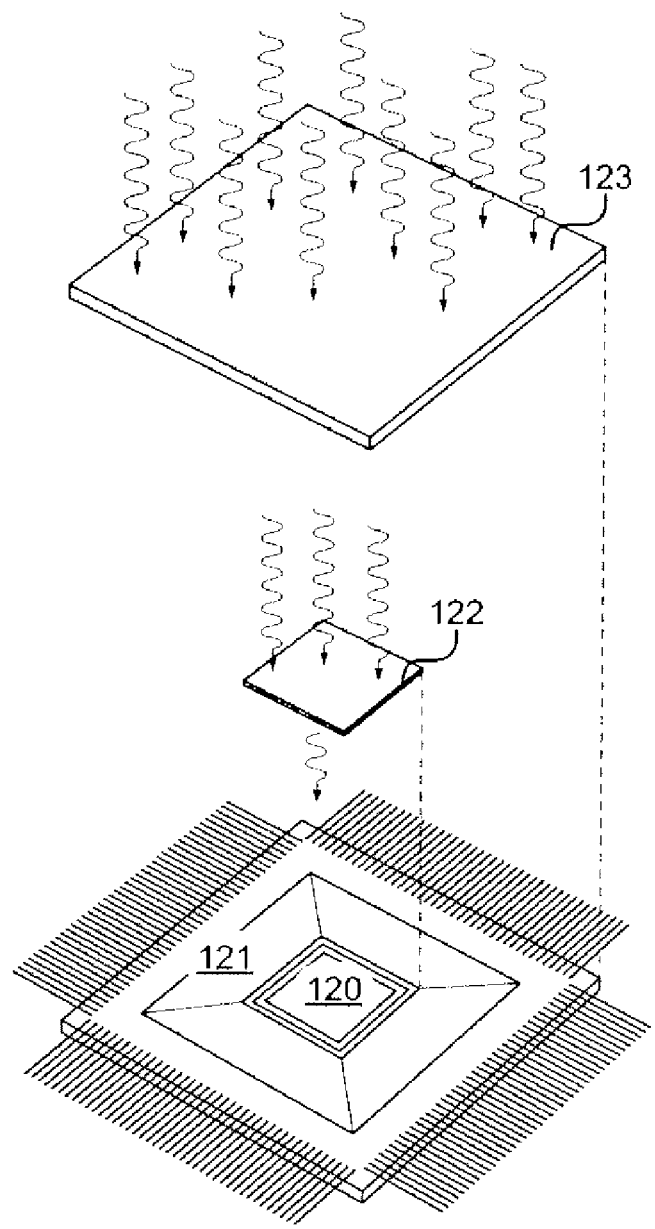
FIG. 1 illustrates a integrated circuit and integrated circuit die implemented in accordance with an embodiment of the invention.

FIG. 1A illustrates an IC die implemented in accordance with an embodiment of the invention. An IC die 120 is embedded in a package 121. The die 120 is covered with an x-ray blocking cover 122. In some embodiments, the cover 122 may be bonded directly to the die 120, for example, by bonding the cover to a polymer overcoat on the die 120. In other embodiments, the cover 122 is bonded to the package 121 during manufacture after the die 120 is packaged. In further embodiments, a second x-ray blocking cover 123 is disposed to cover the entire package 121 in place of, or in addition to, a standard package cover.

Figure 1B:
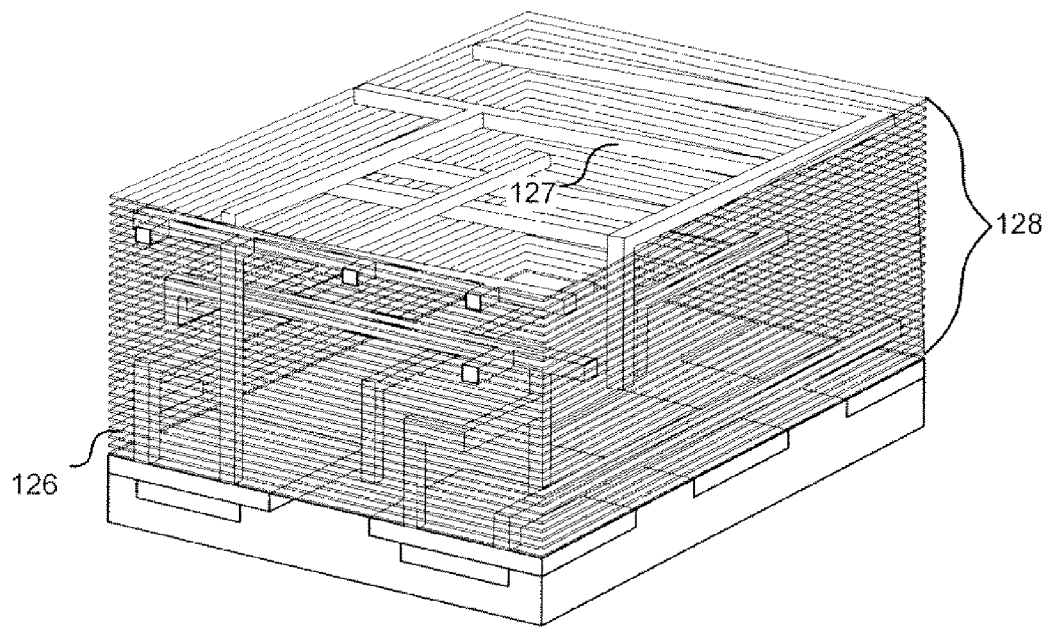
Figure 1B:
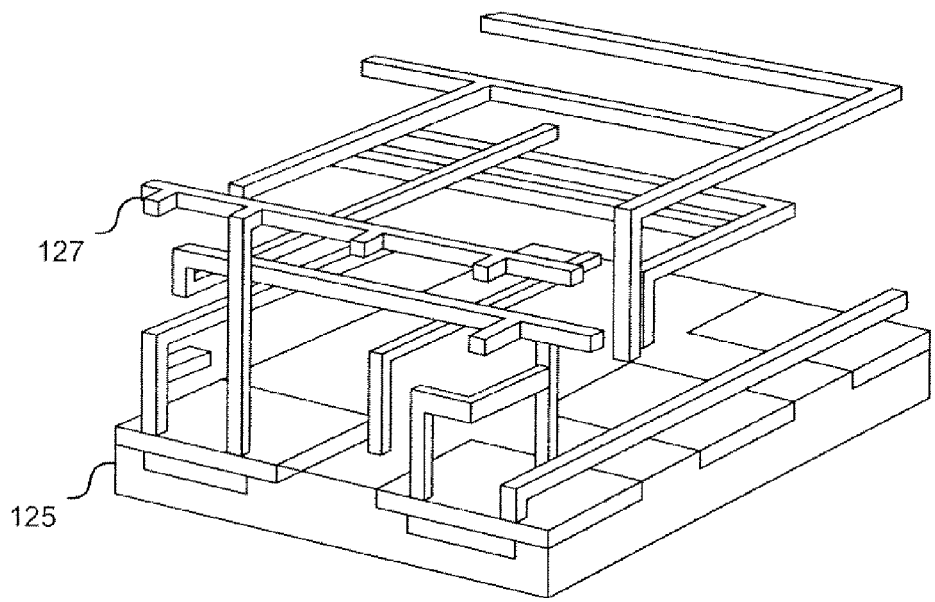

FIG. 1B illustrates an exemplary portion of IC die 120, FIG. 1B includes a view of the portion with interconnect dielectric layers present and removed. In the illustrated embodiment, the die 120 comprises a plurality of different layers. A device 125 layer comprises one or more layers of semiconductor material patterned with individual semiconductor devices during front end of the line (FEOL) manufacturing stages. An interconnect layer 128 comprises one or more, distinct layers of dielectric material 126 containing interconnects 127 connecting the devices of the device layer 125 deposited during back end of the line (BEOL) manufacturing stages. The interconnects 127 connect the devices to implement the logical architecture of the IC, and serve functions such as power distribution, signaling, and clock signal distribution. In some embodiments, the interconnects 127 comprise metallic conductors, such as copper, aluminum, silver, gold, or alloys thereof. In further embodiments, interconnects 127 comprise further signaling structures, such as optical interconnects. In some embodiments material 126 may comprise dielectrics such as such as silicon dioxide or low-κ materials, such as carbon-doped silicon dioxide, or polymers such as spin-on organic polymeric dielectric. Sealing layers comprising silicon nitride, phosphor-silicate glass, nitrides, oxides, polymers, or other materials are disposed on the die at the end of BEOL or during back-end advanced packaging. In various embodiments, nanoparticles of materials that are harder than the interconnect materials 127 or embedding materials 126 are disposed within the embedding materials 126 or within the sealing layers. The hard nanoparticles may comprise diamond nanoparticles, tungsten nanoparticles, tungsten carbides, silicon carbides, niobium carbides, boron carbides, or other hard nanoparticles. The hard nanoparticles are more resistant to evaporation by FIB than the surrounding interconnect materials 127 or embedding materials 126. FIB imaging or sample preparation is thereby disrupted because dwell time for the FIB beam spot to evaporate the hard nanoparticles destroys the surrounding and lower layer interconnect or embedding material. Alternatively, if the hard nanoparticles are not removed, they interfere with imaging lower layers of the IC.

Figure 2:
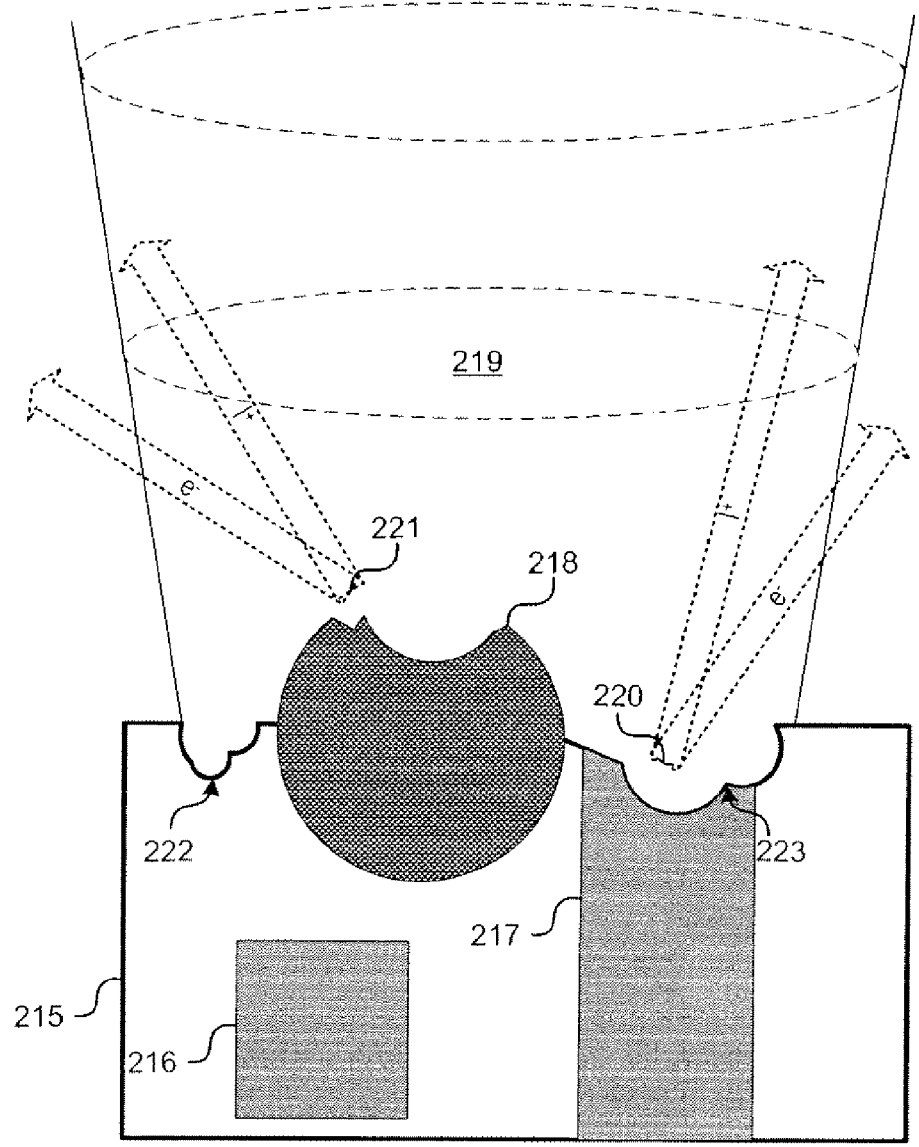
FIG. 2 illustrates the effect of a hard nanoparticle on a focused ion beam in accordance with an embodiment of the invention.

FIG. 2 illustrates hard nanoparticle FIB deterrence implemented in accordance with an embodiment of the invention. In the illustrated embodiment, an IC includes a dielectric material layer 215 having interconnects 216 and 217 embedded within it. A hard nanoparticle 218, with a size near the feature size of the interconnects 216 and 217, is also embedded in the dielectric 215. A focused ion beam 219 images the IC by evaporating 221 and 220 atoms on the exposed surface of the IC. The evaporation 221 and 220 forms secondary ions and electrons that may be imaged directly, for example using a similar electrostatic lens system as a SEM. Alternatively, after section preparation with the FIB, SEM imaging may be conducted on the exposed surface.

The nanoparticle 218 has a hardness greater than the surrounding dielectric material 215 and the interconnects 217. Accordingly, the FIB 219 evaporates the nanoparticle 218 slower than the surrounding dielectric 222 or interconnect 223. To successfully remove the hard nanoparticle 218, the FIB must increase its beam power or increase the time the beam 219 dwells at the nanoparticle's location. In either case, by the time the nanoparticle has been removed, the surrounding material 222 and 223 will be removed without being successfully imaged. In some cases, the damage to the surrounding materials may even extend to layers below the layer currently being imaged. If the hard nanoparticle 218 is not removed, then features within the particle's shadow, such as interconnect 216 will not be successfully imaged.

Figure 3:
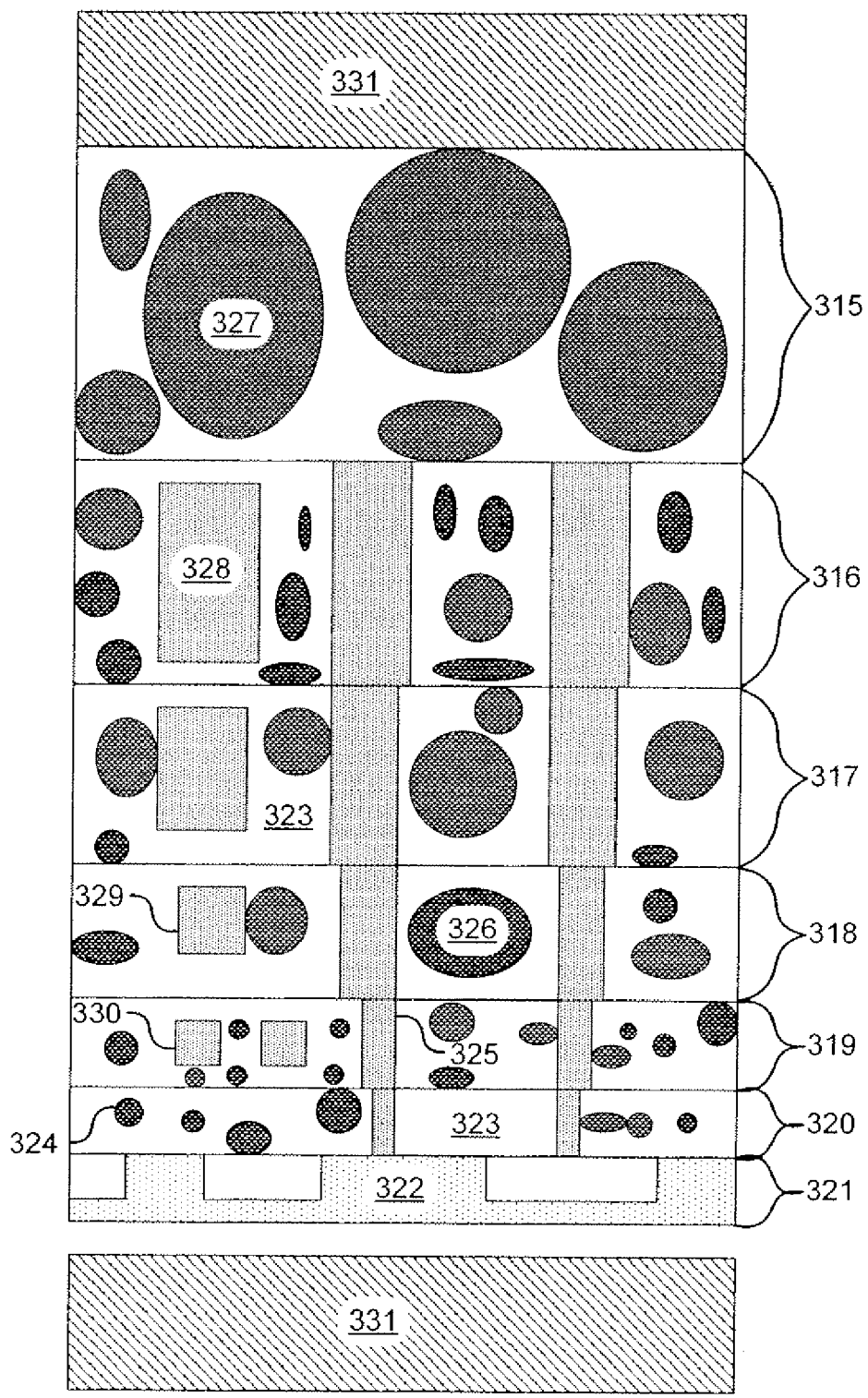
FIG. 3 illustrates an exemplary cross-section of at integrated circuit die implemented in accordance with an embodiment of the invention.

FIG. 3 illustrates an IC implemented in accordance with an embodiment of the invention. The IC comprises a plurality of layers, including semiconductor device layers 321, interconnect layers 315-320, and an overcoat or seal layer 315. Although only two semiconductor layers 321 and five interconnect layers 315-320 are illustrated, in actual IC dies there may be more of these layers. Additional, ICs typically comprises a variety of other materials that are not illustrated, such as high-k dielectric materials in the semiconductor layers 321, etch stop layers, solder bumps, barrier layers, seed layers, etc. As described above, a plurality of hard nanoparticles, 327, 326, and 324 are embedded within an embedding material 323. The number of interconnect layers varies depending on IC type, where six or more interconnect layers are not uncommon. In many ICs, the interconnect layers are divided into different types. Local interconnect layers, such as layers 320 and 319 connect devices 322 formed in the semiconductor layers 321 together into logic units. Local interconnects tend to be short and tend to scale with the semiconductor layer 321. Global interconnect layers, such as layers 316 and 317 connect distant parts of the chip, and accordingly tend to scale less with feature size of the semiconductor devices. In between these, a variety of intermediate layers such as layer 318 have distances and sizes between those of the local interconnects and global interconnects. In such IC chips, the sizes and depths of the layers varies according to function. Local interconnect layers tend to be thinnest, with the smallest feature size of local interconnects 325 and 330. Intermediate interconnect layers are larger, with larger interconnect feature sizes. The global interconnect layers tend to be the thickest with the largest interconnect feature sizes. For example, in the 45 nm process, the local interconnect layers are around 100 nm thick, the intermediate layers are around 500 nm thick, and the global intermediate layers are around 1,000 nm thick. The topcoat or seal layer 315 tends to be significantly thicker, and may be 10 µm or more.

In some embodiments, the hard nanoparticle sizes, shapes, and compositions vary throughout the IC. For example, the hard nanoparticles may vary between less than 1 nm to more than 30 µm according to the embedding material and surrounding features. They may vary in shape among various spheres, rods, cones, cubes, cylinders, disks, irregular shapes, and various other shapes. They may comprise various materials such as diamond nanoparticles, tungsten nanoparticles, tungsten carbides, silicon carbides, niobium carbides, boron carbides, or other nanoparticles that are harder than other IC materials.

In some embodiments, the nanoparticle sizes vary according to their location and depth in the IC. For example, the hard nanoparticles in the upper sealing or overcoat layer are sized such that they present a cross section to the ion beam that is larger than the feature size of the interconnects in the layers below. For example, they may have diameters between 100 nm and the approximate depth of the layer in which they are embedded. These larger nanoparticles block multiple features of the layers below simultaneously. In this example, the nanoparticles in the lower interconnect layers have sizes that are smaller than the scale of the interconnect features. These smaller nanoparticles fit between features of the interconnects. For example, they may a range of diameters smaller than the typical beam size used in FIB analysis of ICs.

The nanoparticle shapes may also vary. For example, the nanoparticles may comprise spheres, rods, cones, cubes, cylinders, disks, irregular shapes, and various other shapes. In one embodiments, the shape is configured to increase the size of the particle in one or two dimensions. For example, a sealing or overcoat layer, such as a SiN isolating film, disposed above the uppermost interconnect layer may have a thickness on the order of 500 mm but may be free of interconnects or other structures. Accordingly, in such a layer nanoparticles such as cylinders, rods, or disks, with heights less than the height of the layer but with widths and lengths longer than the height of the layer can obscure interconnect features in lower layers while still being embedded in the sealing or overcoat layer. In other embodiments, different nanoparticles may have non-isotropic etching properties. For example, a crystalline nanoparticle have different hardness values in different crystallographic directions. For these nanoparticles, the shapes may be configured to increase the surface area of the harder faces of the nanoparticles. In further embodiments, certain nanoparticles may be configured to further disrupt the FIB imaging process. For example, cubic nanoparticles may provide reflective surfaces for the ions, resulting in increased damage to the surrounding IC damage when they are struck with the ion beam.

In particular embodiments, the hard nanoparticles in the upper layers have varying diameters in the range between about 100 nm and 5 µm. In these embodiments, the hard nanoparticles in the interconnect layers have diameters between about 1 nm and an upper size defined by feature size and depth of the particular interconnect layer they are embedded in. For example, the upper size may vary according to whether the hard nanoparticles are in a local interconnect layer, a global interconnect layer, or an intermediate interconnect layer. In some embodiments, the varying diameters prevents adapting the FIB machine to mitigate the effects of the hard nanoparticles.

Figure 4:
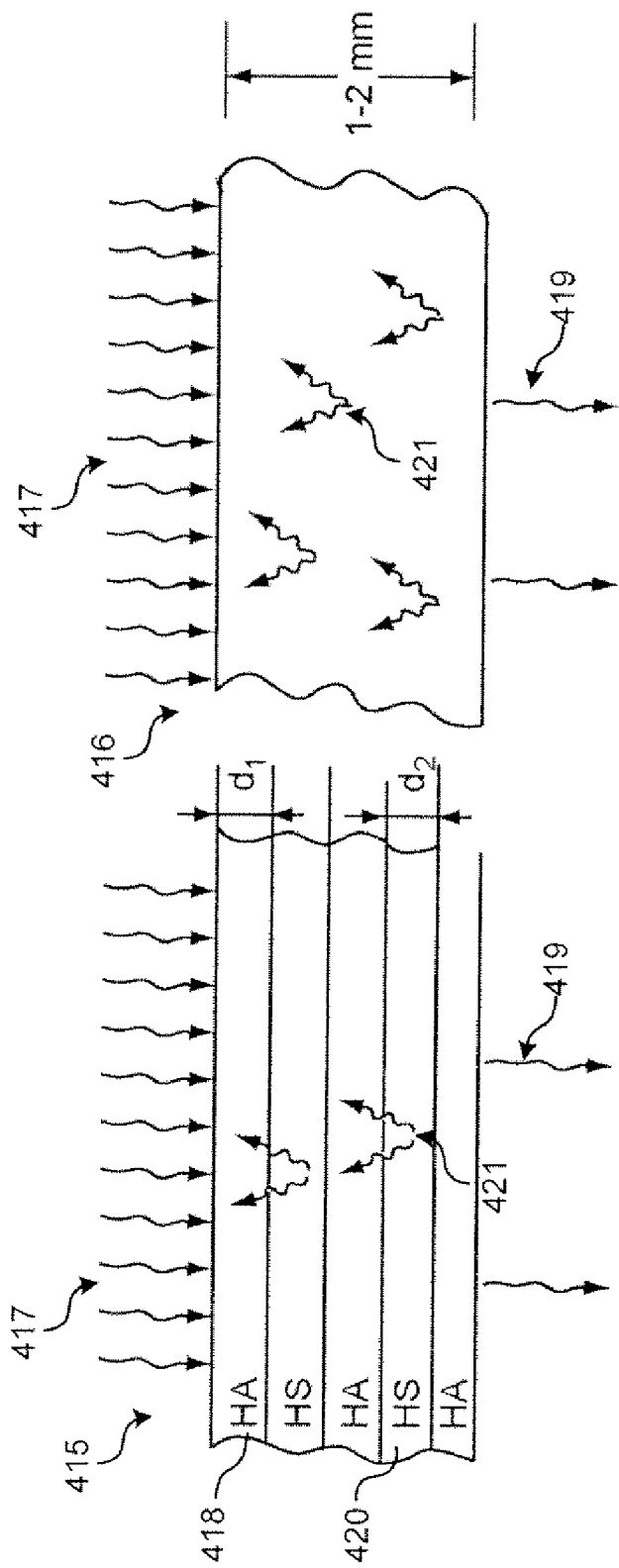
FIG. 4 illustrates an x-ray blocking material implemented in accordance with an embodiment of the invention.

In further embodiments, an x-ray blocking material 331 is disposed over the IC, under the IC, or both, to prevent x-ray imaging of the IC. In some embodiments, the x-ray blocking material 331 is bonded to uppermost IC layer. In further embodiments, a layer of x-ray blocking material is disposed under the IC, for example, by bonding to the IC substrate. FIG. 4 illustrates the operation of such an blocking material. A multi-layer x-ray blocking material 415 comprises one or more layers of highly x-ray a attenuating material 418, such as tungsten or titanium. An x-ray beam 417 passing through such material is attenuated 419, reducing its effectiveness in imaging. In some embodiments, the attenuation criteria for a material 418 is that $-\beta w \leq -9$, where $\beta$ is the x-ray attenuation coefficient of the material in $cm^{-1}$ and w is the total width of the attenuating material 418. With these criteria, $e^{(-\beta w)} = 1.234 \times 10^{-4} \approx 0$ and sufficient x-ray attenuation occurs to prevent x-ray imaging. In typical x-ray imaging systems the photon energy $E_{ph} > 10$ keV. For these x-ray energies, tungsten and titanium are example materials that have relatively small required thicknesses. For $E_{ph} = 30$ keV, for tungsten, $w_W = 0.205$ mm and for titanium, $w_{Ti} = 0.18$ mm. In some embodiments, the attenuating material 418 may be present as a plurality of layers, where the total thickness of the layers meets the attenuation requirements of the application.

The x-ray blocking material further comprises a scattering material 420. The scattering material has a relatively large amount of Compton backscattering 421 relative to the IC materials, creating a source of noise for Compton backscattering, imaging. This noise obscures and prevents Compton backscattering based imaging of the IC die. For Compton backscattering, the differential reflection coefficient has the form:

$$\frac{dR}{d\Omega} = \frac{1}{2\mu}\left(\frac{Z}{M}\right)N_A \frac{d\sigma_{kN}}{d\Omega} S_N(X, Z) \quad (2\text{-}1)$$

where dR is the differential reflectance, $d\Omega$ is the differential solid angle, $\mu$, is the mass attenuation coefficient in $cm^2/g$, Z is the atomic number, M is the atomic mass, $N_A$ is Avogadro's number, $(d\sigma_{kN}/d\Omega)$ is the Klein-Nishina differential cross-section for Compton scattering, and $S_N(X, Z)$ is the correction factor, with $X=\sin(\theta/2)/\lambda[\text{Å}^{-1}]$, where $\theta$ is the scattering angle ($\theta=180°$, for backscattering), and $\lambda$ is photon wavelength. For example, for Eph=100 keV, and $\theta=180°$, X=8.06 Å$^{-1}$, and $S_N \cong 1$, while the differential Klein-Nishina cross-section depends only on angle $\theta$, and k=Eph/$m_e c^2$, where $m_e^-$ is the electron rest mass, and c is the speed of light in a vacuum. The value of Z/M is almost constant (equal to 0.5) for all elements except hydrogen; so the material selectivity of the Compton scattering depends mostly on $\mu^{-1}$: the smaller the $\mu$ value, the larger the Compton scattering effect. For single element materials, the smallest $\mu$ values are for aluminum (Z=13, M=27), $\mu$0.17 $cm^2/g$; carbon (Z=6, M=12.01), $\mu$=0.151 $cm^2/g$; silicon (Z=14, M=28.08), $\mu$=0.183 $cm^2/g$; and titanium (Z=22, M=47.86), $\mu$=0.272 $cm^2/g$.

In some embodiments, the x-ray blocking material 415 may be composed of a plurality of different materials, such as different layers of attenuating and noisy materials, such as layers of aluminum as the noisy material and tungsten as the attenuating material. In some embodiments, These layers may be bonded together, for example through soldering, welding, brazing, transient liquid phase bonding, etc. In other embodiments, the x-ray blocking material 416 may be comprise a single layer of a material, such as titanium, or an alloy of a noisy and an attenuating material, that has both noisy and attenuating properties.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof: the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or aft any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. An integrated circuit die, comprising:
   a device layer comprising a plurality of semiconductor devices;
   an interconnect layer comprising a plurality of interconnect paths connecting the semiconductor devices and embedded in a dielectric material;
   a plurality of hard nanoparticles embedded in the dielectric material of the interconnect layer, the hard nanoparticles having a hardness greater than a hardness of the dielectric material and of a hardness of the interconnect paths; and
   an x-ray blocking material having a mass attenuation coefficient below a predetermined noise threshold and having an x-ray attenuation coefficient above a predetermined attenuation threshold;
   wherein the x-ray blocking material is disposed between the interconnect paths and an exterior of the integrated circuit die; and
   wherein the x-ray blocking material comprises a first layer of a first material having the mass attenuation coefficient below the predetermined noise threshold and a second layer of a second material having the x-ray attenuation coefficient above the predetermined attenuation threshold.

2. The integrated circuit die of claim 1, wherein the plurality of hard nanoparticles embedded in the dielectric material have a plurality of different sizes, such that the hard nanoparticles are smaller than a distance between adjacent interconnect paths.

3. The integrated circuit die of claim 2, wherein the sizes are between 1 nm and 100 nm.

4. The integrated circuit die of claim 1, further comprising:
   a sealing or overcoat layer over the interconnect layer, comprising a sealing or overcoat material; and
   a second plurality of hard nanoparticles embedded in the sealing or overcoat layer, the second plurality of hard nanoparticles having a hardness greater than a hardness of the sealing or overcoat material.

5. The integrated circuit die of claim 4, wherein the second plurality of hard nanoparticles embedded in the dielectric material have a plurality of different sizes, such that the hard nanoparticles are larger than the distance between adjacent interconnect paths.

6. The integrated circuit die of claim 5, wherein the sizes of the second plurality of hard nanoparticles are between 100 nm and 10 μm.

7. The integrated circuit die of claim 1, wherein the hard nanoparticles comprise tungsten, diamond, or a carbide.

8. The integrated circuit die of claim 1, wherein the first material comprises aluminum and the second material comprises tungsten.

9. The integrated circuit die of claim 1, wherein the x-ray blocking material comprises a single layer of a single material having the mass attenuation coefficient below the predetermined noise threshold and having the x-ray attenuation coefficient above the predetermined attenuation threshold.

10. The integrated circuit die of claim 9, wherein the single material comprises tungsten.

11. The integrated circuit die of claim 1, wherein the x-ray blocking material comprises a coating on an uppermost coating layer.

12. A method of manufacturing an integrated circuit die, comprising:
- forming a device layer comprising a plurality of semiconductor devices;
- forming an interconnect layer comprising a plurality of interconnect paths connecting the semiconductor devices and embedded in a dielectric material;
- embedding a plurality of hard nanoparticles in the dielectric material of the interconnect layer, the hard nanoparticles having a hardness greater than a hardness of the dielectric material and of a hardness of the interconnect paths; and
- disposing an x-ray blocking material between the interconnect paths and an exterior of the integrated circuit die, the x-ray blocking material having a mass attenuation coefficient below a predetermined noise threshold and having an x-ray attenuation coefficient above a predetermined attenuation threshold;
- wherein the x-ray blocking material comprises a first layer of a first material having the mass attenuation coefficient below the predetermined noise threshold and a second layer of a second material having the x-ray attenuation coefficient above the predetermined attenuation threshold.

13. The method of claim 12, wherein the plurality of hard nanoparticles embedded in the dielectric material have a plurality of different sizes, such that the hard nanoparticles are smaller than a distance between adjacent interconnect paths.

14. The method of claim 13, wherein the sizes are between 1 nm and 100 nm.

15. The method of claim 12, further comprising:
- depositing a sealing or overcoat layer over the interconnect layer, comprising a sealing or overcoat material; and
- embedding a second plurality of hard nanoparticles in the sealing or overcoat layer, the second plurality of hard nanoparticles having a hardness greater than a hardness of the sealing or overcoat material.

16. The method of claim 15, wherein the second plurality of hard nanoparticles embedded in the dielectric material have a plurality of different sizes, such that the hard nanoparticles are larger than the distance between adjacent interconnect paths.

17. The method of claim 16, wherein the sizes of the second plurality of hard nanoparticles are between 100 nm and 10 μm.

18. The method of claim 12, wherein the hard nanoparticles comprise tungsten, diamond, or a carbide.

19. The method of claim 12, wherein the first material comprises aluminum and the second material comprises tungsten.

20. The method of claim 12, wherein the x-ray blocking material comprises a single layer of a single material having the mass attenuation coefficient below the predetermined noise threshold and having the x-ray attenuation coefficient above the predetermined attenuation threshold.

21. The method of claim 20, wherein the single material comprises tungsten.

22. The method of claim 12, wherein the x-ray blocking material comprises a coating on an uppermost coating layer.

23. An integrated circuit, comprising:
- a package;
- an integrated circuit die within the package, the integrated circuit die comprising:
  - a device layer comprising a plurality of semiconductor devices;
  - an interconnect layer comprising a plurality of interconnect paths connecting the semiconductor devices and embedded in a dielectric material; and
  - a plurality of hard nanoparticles embedded in the dielectric material of the interconnect layer, the hard nanoparticles having a hardness greater than a hardness of the dielectric material and of a hardness of the interconnect paths; and
  - an x-ray blocking material having a mass attenuation coefficient below a predetermined noise threshold and having an x-ray attenuation coefficient above a predetermined attenuation threshold;
  - wherein the x-ray blocking material is disposed between the interconnect paths and an exterior of the integrated circuit die; and
  - wherein the x-ray blocking material comprises a first layer of a first material having the mass attenuation coefficient below the predetermined noise threshold and a second layer of a second material having the x-ray attenuation coefficient above the predetermined attenuation threshold.

24. The integrated circuit of claim 23, wherein the plurality of hard nanoparticles embedded in the dielectric material have a plurality of different sizes, such that the hard nanoparticles are smaller than a distance between adjacent interconnect paths.

25. The integrated circuit of claim 23, the integrated circuit die further comprising:
- a sealing or overcoat layer over the interconnect layer, comprising a sealing or overcoat material; and
- a second plurality of hard nanoparticles embedded in the sealing or overcoat layer, the second plurality of hard nanoparticles having a hardness greater than a hardness of the sealing or overcoat material.

26. The integrated circuit of claim 25, wherein the second plurality of hard nanoparticles embedded in the dielectric material have a plurality of different sizes, such that the hard nanoparticles are larger than the distance between adjacent interconnect paths.

27. The integrated circuit of claim 24, wherein the x-ray blocking material comprises a single layer of a single material having the mass attenuation coefficient below the predetermined noise threshold and having the x-ray attenuation coefficient above the predetermined attenuation threshold.

28. The integrated circuit of claim 23, wherein the first material comprises aluminum and the second material comprises tungsten.

29. The integrated circuit of claim 27, wherein the single material comprises tungsten.

30. The integrated circuit of claim 23, wherein the x-ray blocking material comprises a coating on an uppermost coating layer.

* * * * *